United States Patent
Yamaguchi et al.

(10) Patent No.: US 8,992,743 B2
(45) Date of Patent: Mar. 31, 2015

(54) SPUTTERING METHOD AND SPUTTERING APPARATUS

(75) Inventors: Nobuo Yamaguchi, Tama (JP); Kazuaki Matsuo, Inagi (JP)

(73) Assignee: Canon Anelva Corporation, Kawasaki-Shi, Kanagawa-ken (JP)

( * ) Notice: Subject to any disclaimer, the term of this patent is extended or adjusted under 35 U.S.C. 154(b) by 51 days.

(21) Appl. No.: 13/483,370

(22) Filed: May 30, 2012

(65) Prior Publication Data

US 2012/0234672 A1    Sep. 20, 2012

Related U.S. Application Data

(63) Continuation-in-part of application No. PCT/JP2010/007139, filed on Dec. 8, 2010.

(30) Foreign Application Priority Data

Dec. 25, 2009   (JP) .................................. 2009-293664

(51) Int. Cl.
*C23C 14/50*   (2006.01)
*C23C 14/00*   (2006.01)
*C23C 14/34*   (2006.01)
(Continued)

(52) U.S. Cl.
CPC ............ *C23C 14/505* (2013.01); *C23C 14/0063* (2013.01); *C23C 14/3492* (2013.01); *C23C 14/564* (2013.01); *H01J 37/3408* (2013.01); *H01J 37/3447* (2013.01)
USPC .............. 204/192.12; 204/192.1; 204/298.06; 204/192.15; 118/704

(58) Field of Classification Search
None
See application file for complete search history.

(56) References Cited

U.S. PATENT DOCUMENTS

| | | | | | |
|---|---|---|---|---|---|
| 5,827,408 | A | * | 10/1998 | Raaijmakers | ............ 204/192.12 |
| 5,868,914 | A | * | 2/1999 | Landsbergen et al. | ... 204/298.06 |
| 2008/0264337 | A1 | * | 10/2008 | Sano et al. | .................... 118/704 |

(Continued)

FOREIGN PATENT DOCUMENTS

| JP | 63-060278 A | 3/1988 |
|---|---|---|
| JP | 63-238263 A | 10/1988 |

(Continued)

OTHER PUBLICATIONS

International Search Report (PCT/ISA/210) issued on Mar. 15, 2011, by the Japanese Patent Office as the International Searching Authority for International Application No. PCT/JP2010/007139.

(Continued)

*Primary Examiner* — Timon Wanga
(74) *Attorney, Agent, or Firm* — Buchanan Ingersoll & Rooney PC

(57) ABSTRACT

This invention provides a sputtering method which can generate an electric discharge under practical conditions and maintain the pressure in a plasma space uniform, and a sputtering apparatus used for the same. The sputtering method includes a first gas introduction step (step S403) of introducing a process gas from a first gas introduction port formed in a sputtering space defined by a deposition shield plate, a substrate holder, and the target which are disposed in a process chamber, a voltage application step (step S407) of applying a voltage to the target after the first gas introduction step, and a second gas introduction step (step S405) of introducing a process gas from a second gas introduction port formed outside the sputtering space.

20 Claims, 8 Drawing Sheets

(51) Int. Cl.
*C23C 14/56* (2006.01)
*H01J 37/34* (2006.01)

(56) References Cited

U.S. PATENT DOCUMENTS

| | | | | |
|---|---|---|---|---|
| 2010/0224482 | A1* | 9/2010 | Yamaguchi et al. | 204/192.15 |
| 2010/0236918 | A1* | 9/2010 | Imakita et al. | 204/192.1 |

FOREIGN PATENT DOCUMENTS

| | | | |
|---|---|---|---|
| JP | 5-055206 | A | 3/1993 |
| JP | 5-247639 | A | 9/1993 |
| JP | 6-346234 | A | 12/1994 |
| JP | 11-200032 | A | 7/1999 |
| JP | 11-229132 | A | 8/1999 |
| JP | 2000-204469 | A | 7/2000 |
| JP | 2002-129320 | A | 5/2002 |
| JP | 2004-018885 | A | 1/2004 |
| JP | 2004-349370 | A | 12/2004 |

OTHER PUBLICATIONS

Written Opinion (PCT/ISA/237) issuded on Mar. 15, 2011, by the Japanese Patent Office as the International Searching Authority for International Application No. PCT/JP2010/007139.

Office Action (Ground of Rejection) issued on Feb. 10, 2014, by the Japanese Patent Office in corresponding Japanese Patent Application No. 2011-547271, and an English Translation of the Office Action. (14 pages).

* cited by examiner

F I G. 4
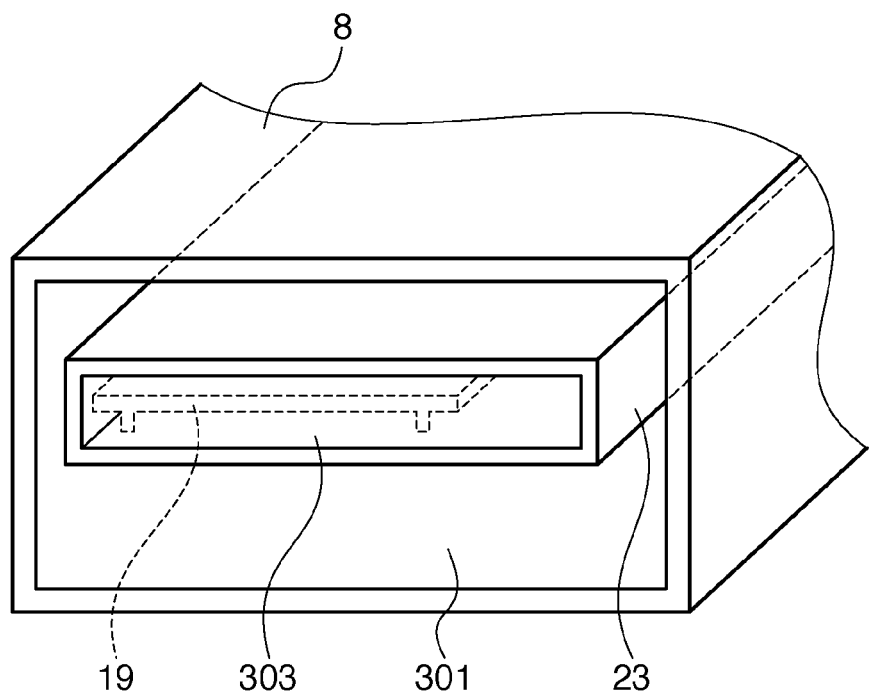
F I G. 5
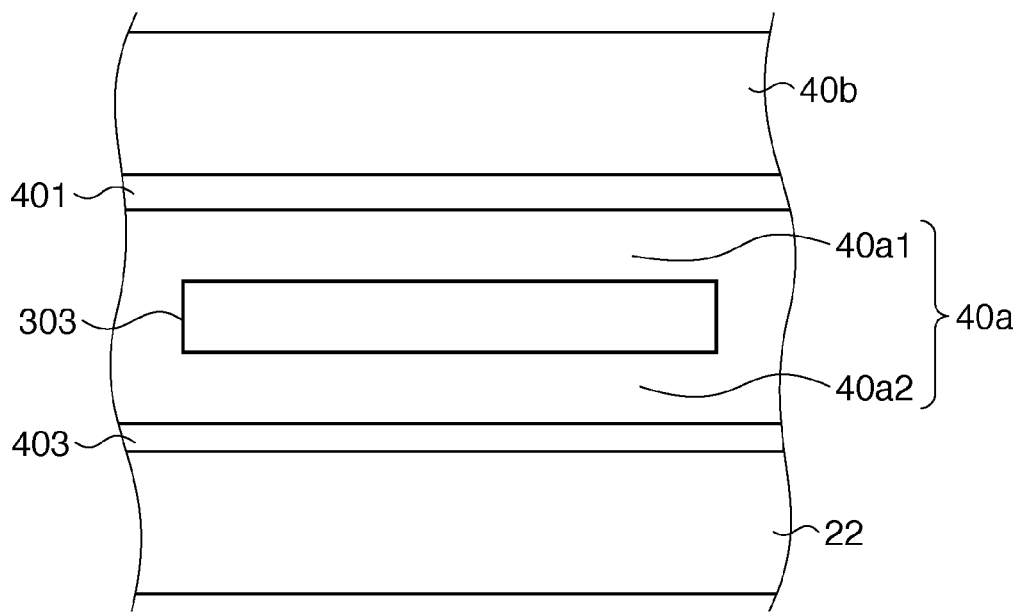

SPUTTERING METHOD AND SPUTTERING APPARATUS

The present application is a continuation-in-part of PCT/JP2010/007139, filed on Dec. 8, 2010, and which claims the priority of JP 2009-293664, filed on Dec. 25, 2009. The present application incorporates by reference the entire contents of PCT/JP2010/007139 and JP 2009-293664.

TECHNICAL FIELD

The present invention relates to a sputtering method and sputtering apparatus used to manufacture, for example, a semiconductor device.

BACKGROUND ART

Conventionally, a sputtering apparatus is provided with a deposition shield plate to prevent sputter particles from adhering to the inner wall of a chamber. As methods of introducing a process gas into the chamber, so-called external gas introduction in which a gas is introduced from the exterior of the deposition shield plate, and so-called internal gas introduction in which a gas is introduced from the interior of the deposition shield plate are available.

As an example of external gas introduction, PTL1 discloses a sputtering apparatus that includes a deposition shield plate which defines a sputtering space in a vacuum chamber, and forms, on the surface of a wafer placed on a wafer stage in the vacuum chamber, a thin film of metal particles sputtered from a sputter target disposed in the vacuum chamber. This sputter apparatus also includes a sputter gas introduction port which is formed in the chamber wall surface and introduces a sputter gas containing argon and a reactive gas into the vacuum chamber, and a plurality of perforated shield plates arranged along the chamber wall surface so as to cover the chamber wall surface and the sputter gas introduction port.

Also, as an example of internal gas introduction, PTL2 discloses a sputtering apparatus which generates a plasma discharge in a vacuum to deposit a thin film on a substrate. This sputtering apparatus is provided with a cylindrical shield which surrounds the space in which a plasma discharge is generated, and a process gas introduction mechanism including a gas blowoff port in the inner circumferential surface of the cylindrical shield.

CITATION LIST

Patent Literature

PTL1: Japanese Patent Laid-Open No. 5-55206
PTL2: Japanese Patent Laid-Open No. 6-346234

SUMMARY OF INVENTION

Technical Problem

In the sputtering apparatus disclosed in PTL1, a process gas such as argon gas is introduced to the exterior of the space defined by the deposition shield plate, so a large amount of process gas must be used to obtain the pressure of the gas in the vicinity of the target, which is required for plasma ignition. This makes it necessary to frequently actuate a cryopump as an entrapment vacuum pump, thus considerably lowering productivity. Also, since a large amount of gas must be supplied to the apparatus, the cost of raw materials rises. Furthermore, the introduced gas spreads from the exterior to interior of the defined space, so it takes a significant amount of time to spread this gas up to the pressure required for plasma ignition. Especially when the process gas is consumed in a short period of time, as in plasma ignition, the pressure in the defined space may fluctuate.

On the other hand, in the sputtering apparatus disclosed in PTL2, when a gas is introduced into the plasma space surrounded by the cylindrical shield, the pressure in the plasma space varies due to shield processing and assembly variations because the density of argon gas in the plasma space is determined depending on the size of the shield opening (gap). Further, in recent years, with an improvement in performance of semiconductor devices, a demand for an improvement in quality of a thin film is soaring. However, the inventors of the present invention found that maintenance such as shield replacement makes it impossible to obtain a given process reproducibility and, in turn, to form a film with high quality. The inventors of the present invention conducted a close examination of the cause of this fact, and found that the pressure in the plasma space changes before and after the maintenance.

The present invention has been made in consideration of the above-mentioned problems of the conventional sputtering apparatuses, and has as its object to provide a sputtering method which can generate an electric discharge under practical conditions and maintain the pressure in a plasma space uniform with high reproducibility even when maintenance such as shield replacement is done, and a sputtering apparatus used for the same.

Solution to Problem

According to an aspect of the present invention, there is provided a sputtering method by applying a voltage to a target in a process chamber and performing sputtering, comprising a first gas introduction step of introducing a process gas from a first gas introduction port formed in a sputtering space defined by a deposition shield plate, a substrate holder, and the target which are disposed in the process chamber, a voltage application step of applying the voltage to the target after the first gas introduction step, and a second gas introduction step of introducing a process gas from a second gas introduction port formed outside the sputtering space.

According to another aspect of the present invention, there is provided a sputtering apparatus comprising a process chamber, a substrate holder disposed in the process chamber, a target holder which is disposed in the process chamber and configured to hold a target, a deposition shield plate which is disposed in the process chamber and forms a sputtering space between the target holder and the substrate holder, a first gas introduction port which is formed in the sputtering space and configured to introduce a process gas, a second gas introduction port which is formed outside the sputtering space and configured to introduce a process gas, and a control unit which performs a first gas introduction step of introducing a process gas from the first gas introduction port; a voltage application step of applying the voltage to the target after the first gas introduction step; and a second gas introduction step of introducing a process gas from the second gas introduction port.

Advantageous Effects of Invention

According to the present invention, it is possible to provide a sputtering method which can generate an electric discharge under practical conditions and maintain the pressure in a plasma space uniform, and a sputtering apparatus used for the same.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 4 is a sectional view taken along a line I-I in FIG. 3;

FIG. 5 is a sectional view taken along a line II-II in FIG. 3;

DESCRIPTION OF EMBODIMENTS

Exemplary embodiments of the present invention will be described below with reference to the accompanying drawings. However, constituent components described in these embodiments merely provide examples, so the technical scope of the present invention is determined by the scope of claims and is not limited by the following individual embodiments.

Figure 1:
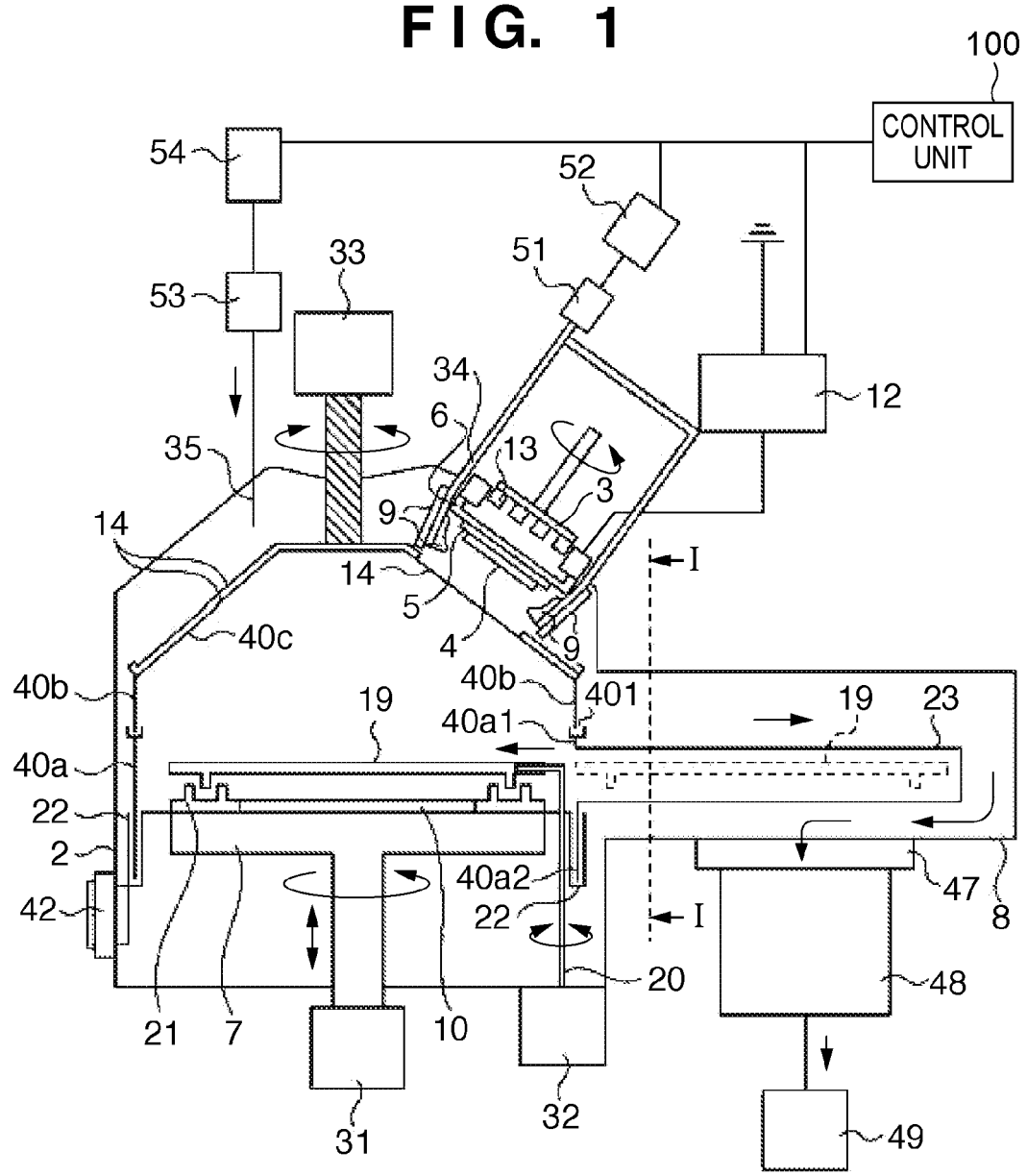
FIG. 1 is a schematic view of a sputtering apparatus according to an embodiment of the present invention.

The overall configuration of a sputtering apparatus according to an embodiment of the present invention will be described with reference to FIG. 1. FIG. 1 is a schematic view of a sputtering apparatus according to an embodiment of the present invention. A sputtering apparatus 1 includes a vacuum chamber 2 which can be evacuated to a vacuum, an exhaust chamber 8 disposed adjacent to the vacuum chamber 2 through an exhaust port, and an exhaust device which evacuates the vacuum chamber 2 through the exhaust chamber 8. Note that the exhaust device includes a turbo-molecular pump 48. Also, a dry pump 49 is connected to the turbo-molecular pump 48 of the exhaust device. Note that the exhaust device is disposed below the exhaust chamber 8 to reduce the footprint of the entire apparatus (the area occupied by the entire apparatus) as much as possible.

A target holder 6 which holds a target 4 through a back plate 5 is disposed in the vacuum chamber 2. A cathode shutter 14 is set near the target holder 6 so as to cover the target holder 6. The cathode shutter 14 has the structure of a rotary shutter. The cathode shutter 14 functions as a shielding member for setting a closed state (shielded state) in which the gap between a substrate holder 7 and the target holder 6 is shielded, or an open state (retracted state) in which the gap between the substrate holder 7 and the target holder 6 is open.

The cathode shutter 14 is provided with a cathode shutter driving mechanism 33 for performing an operation of opening/closing the cathode shutter 14.

A shutter accommodation unit 23 which accommodates a substrate shutter 19 when the substrate shutter 19 is retracted from the vacuum chamber 2 is disposed in the exhaust chamber 8.

A chimney 9 serving as a cylindrical shield is mounted around the target holder 6 in the space between the target holder 6 and the cathode shutter 14 so as to surround the target holder 6. A magnetron discharge space in front of the sputter surface of the target 4 mounted on the target holder 6 is surrounded by the chimney 9, and is open to the opening of the cathode shutter 14 in a shutter open state. A gas pipe 34 is inserted in the cylindrical chimney 9 having a given thickness. The gas pipe 34 is connected to a first gas (inert gas) supply device 52 via a first gas (inert gas) supply system 51. As shown in FIG. 1, by introducing an inert gas from the first gas (inert gas) supply device 52 while the cathode shutter 14 is closed, the plasma density in the vicinity of the target 4 can be maintained high to facilitate ignition. Also, a gas introduction port 35 is provided between the ceiling wall (inner wall) of the vacuum chamber 2 and the cathode shutter 14, and connected to a second gas (inert gas) supply device 54 via a second gas (inert gas) supply system 53.

The inner surface of the vacuum chamber 2 is grounded. A deposition shield plate 40 includes grounded cylindrical deposition shield plates 40a and 40b over the inner surface of the vacuum chamber 2 between the target holder 6 and the substrate holder 7, and a ceiling deposition shield plate 40c so as to cover the inner surface of the vacuum chamber 2, other than the target holder portion opposed to the substrate holder 7 (the deposition shield plates 40a, 40b, and 40c will be also simply referred to as "shields 40a, 40b, and 40c, respectively, hereinafter). A deposition shield plate 40a1 has a U-shaped recessed distal end, and the I-shaped deposition shield plate 40b (projection) is fitted in the U-shaped portion (recess) in a noncontact state to form an exhaust path 401 as a so-called labyrinth-shaped exhaust path (gap). The exhaust path 401 (first exhaust path) formed between the shields 40a1 and 40b is formed at a position above an opening 303 (a position on the side of the target holder 6 which constitutes a deposition means) as a circumferential gap around the cylindrical member. An exhaust path 403 (second exhaust path) formed between shields 40a2 and 22 is formed at a position below the opening 303 as a circumferential gap around the cylindrical member. As described above, since the deposition shield plate 40 is formed by at least one member, gaps are formed by these members.

Note that the deposition shield plate means herein a member which is formed separately from the vacuum chamber 2 so as to prevent sputter particles from directly adhering to the inner surface of the vacuum chamber 2 and thereby to protect the inner surface of the vacuum chamber 2, and can be replaced periodically.

In this manner, the sputtering apparatus 1 includes the first gas port 34 which is placed in a sputtering space defined by the deposition shield plate 40, target 4, and substrate holder 7 disposed in the process chamber 2 and introduces an inert gas into the process chamber 2, and the second gas introduction port 35 which is formed outside the sputtering space and introduces an inert gas into the process chamber 2. Note that the sputtering space does not mean a fully sealed space but means a space in which gases can mutually communicate through a gap 60 formed by the deposition shield plate 40.

Magnets 13 for performing magnetron sputtering are arranged on the back of the target 4 when viewed from the sputter surface. The magnets 13 are held on a magnet holder 3 and can be rotated by a magnet holder rotation mechanism (not shown). To uniform erosion of the target 4, the magnets 13 are rotated during electric discharge.

The target 4 is placed at a position (offset position) obliquely above a substrate 10. That is, the central point of the sputter surface of the target 4 lies at a position shifted by a predetermined distance with respect to a normal to the substrate 10 at its central point. The target holder 6 is connected to a power supply (voltage application mechanism) 12 which supplies sputter discharge power. When the power supply 12 applies a voltage to the target holder 6, electric discharge starts so that sputter particles are deposited on the substrate 10. When the distance between the central point of the target 4 and the intersection point at which a normal to a plane including the upper surface of the substrate holder 7, that passes through the center of the target 4, intersects with the plane is defined as a T/S distance. The T/S distance is 240 mm in this embodiment. Although the sputtering apparatus 1 shown in FIG. 1 includes a DC power supply in this embodiment, the present invention is not limited to this, and the sputtering apparatus 1 may include, for example, an RF power supply. When an RF power supply is employed, it is necessary to place a matching device between the power supply 12 and the target holder 6.

The target holder 6 is insulated from the vacuum chamber 2 at the ground potential by an insulator and made of a metal such as Cu, so it serves as an electrode upon being supplied with DC or RF power. Note that the target holder 6 includes a water channel (not shown) formed in it, and can be cooled by cooling water supplied from a water pipe (not shown). The target 4 contains a material component to be deposited on the substrate 10. Since the target 4 influences the purity of a film to be deposited, it desirably uses a high purity material.

The back plate 5 placed between the target 4 and the target holder 6 is made of a metal such as Cu and holds the target 4.

Also, the vacuum chamber 2 accommodates the substrate holder 7 for mounting the substrate 10, the substrate shutter 19 disposed between the substrate holder 7 and the target holder 6, and a substrate shutter driving mechanism 32 which opens/closes the substrate shutter 19. Note that the substrate shutter 19 is placed near the substrate holder 7, and functions as a shielding member for setting a closed state in which the substrate holder 7 is shielded from the target holder 6, or an open state in which the substrate holder 7 is not shielded from the target holder 6.

A ring-shaped shielding member (to be referred to as a "cover ring 21" hereinafter) is disposed on the outer edge (outer peripheral portion) of the mounting portion of the substrate 10 on the surface of the substrate holder 7. The cover ring 21 prevents sputter particles from adhering to portions other than the deposition surface of the substrate 10 placed on the substrate holder 7. Note that the portions other than the deposition surface include not only the upper surface of the substrate holder 7 covered with the cover ring 21 but also the side and lower surfaces of the substrate 10. The substrate holder 7 is provided with a substrate holder driving mechanism 31 for vertically moving the substrate holder 7 and rotating it at a predetermined speed. The substrate holder driving mechanism 31 vertically moves the substrate holder 7 and fixes it at an appropriate position, thereby appropriately adjusting the distance (T/S distance) between the target and the substrate.

Figure 2:
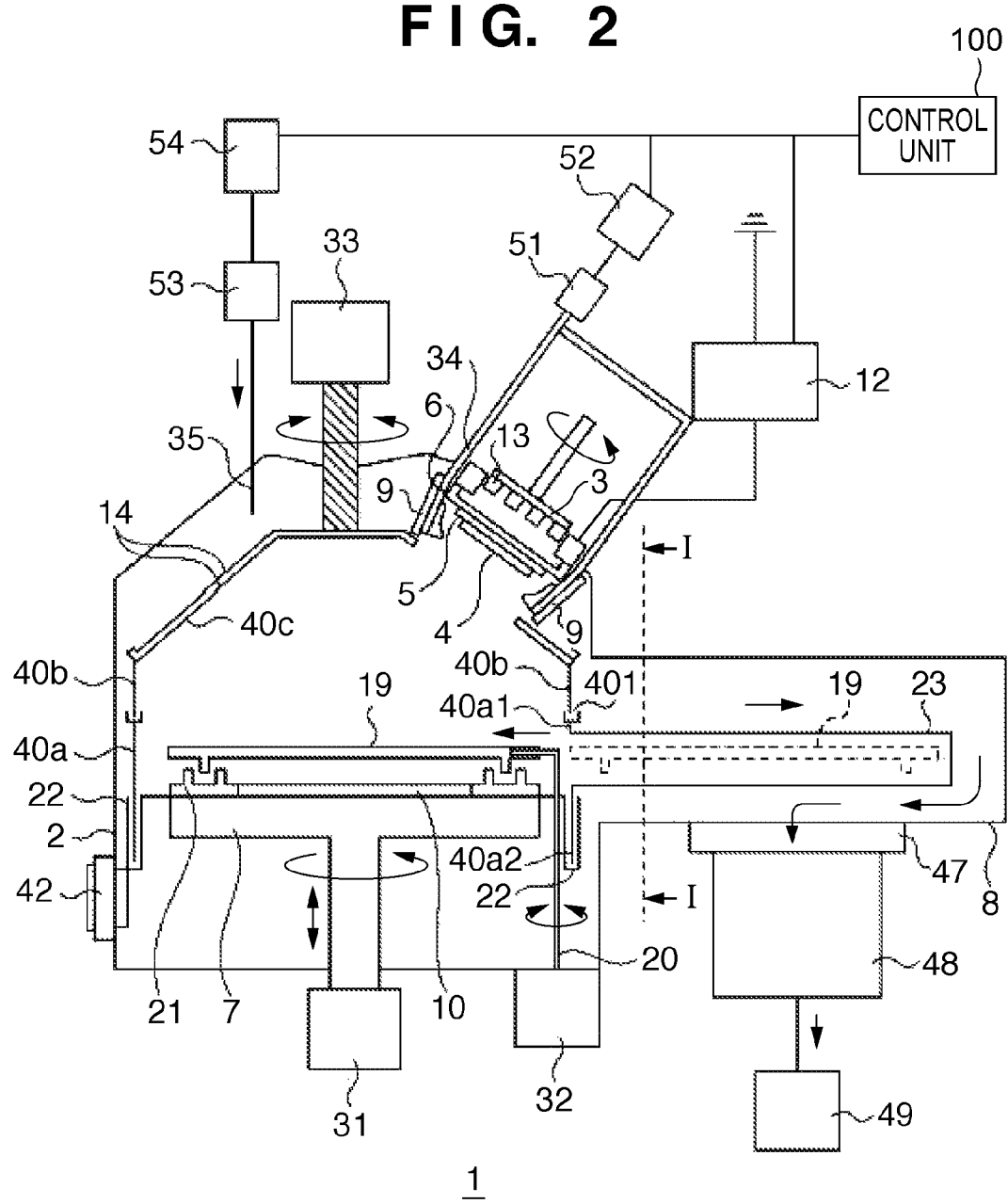
FIG. 2 is a schematic view of the sputtering apparatus according to the embodiment of the present invention.

The sputtering apparatus 1 shown in FIG. 2 has basically the same configuration as that shown in FIG. 1, and the same reference numerals denote the same constituent members, and a detailed description thereof will not be given. FIG. 2 shows the cathode shutter 14 in an open state.

Figure 3:
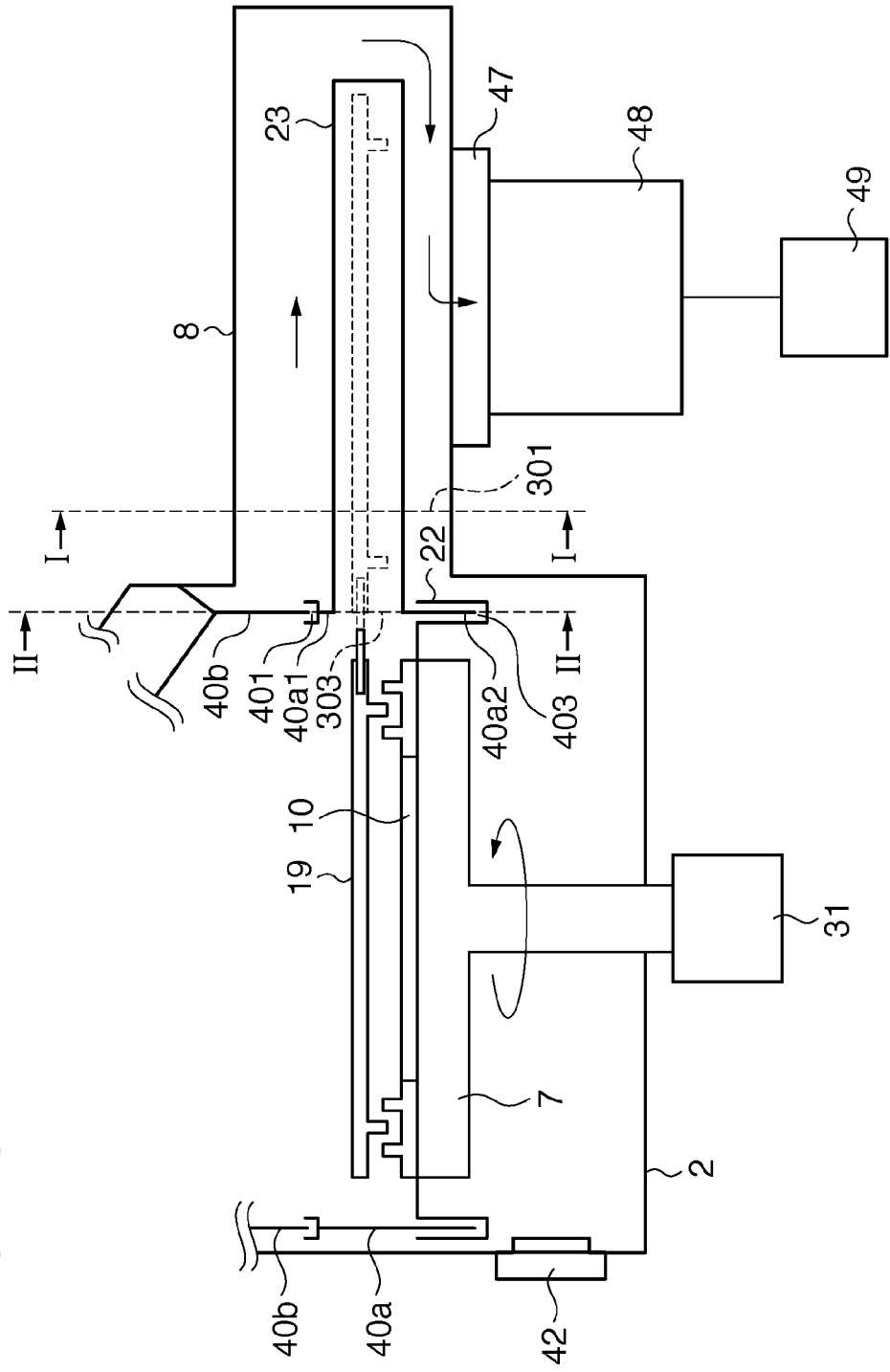
FIG. 3 is an enlarged view for explaining details of an exhaust chamber shown in FIG. 1.

The configuration of the shutter accommodation unit 23 will be described in detail next with reference to FIGS. 3, 4, and 5. FIG. 3 is an enlarged view for explaining details of the exhaust chamber 8. FIG. 4 is a sectional view taken along a line I-I in FIG. 3. FIG. 5 is a sectional view taken along a line II-II in FIG. 3. The shutter accommodation unit 23 which accommodates the substrate shutter 19 when the substrate shutter 19 is retracted from the vacuum chamber 2 is placed in the exhaust chamber 8, as shown in FIG. 3. The shutter accommodation unit 23 includes the opening 303 to extend/retract the substrate shutter 19, and has sealed portions other than the opening 303.

The shutter accommodation unit 23 is disposed in the exhaust chamber 8 so as to form an exhaust region, which communicates with the turbo-molecular pump 48 through a main valve 47, around the shutter accommodation unit 23, as shown in FIG. 4.

FIG. 5 is a view illustrating the peripheral portion defining the opening 303 of the shutter accommodation unit 23. The shield 40a (shields 40a1 and 40a2) and the shields 40b and 22 are formed in a cylindrical shape within the vacuum chamber 2. The exhaust path 401 (first exhaust path) formed between the shields 40a1 and 40b is formed at a position above the opening 303 (a position on the side of the target holder 6 which constitutes a deposition means) as a circumferential gap around the cylindrical member. The exhaust path 403 (second exhaust path) formed between the shields 40a2 and 22 is formed at a position below the opening 303 as a circumferential gap around the cylindrical member.

The shield 40a has an opening (hole) at a position corresponding to the opening 303 of the shutter accommodation unit 23, and functions as a first shield which covers the exhaust port. The shield 40b is disposed above the opening 303 of the shutter accommodation unit 23, and functions as a second shield which covers the exhaust port. The shield 22 is disposed below the opening 303 of the shutter accommodation unit 23, and functions as a third shield which covers the exhaust port. The exhaust conductance of the exhaust path 403 can be changed as the substrate holder driving mechanism 31 moves the substrate holder 7.

The shield 40a1 is fixed around the opening 303 of the shutter accommodation unit 23 so as to cover an exhaust port 301 of the exhaust chamber 8, as shown in FIG. 3 or 5. The shields 40a1 and 40b form the exhaust path 401.

The shield 40a1 has a U-shaped (recessed) distal end, and the I-shaped shield 40b (projection) is fitted in the U-shaped portion (recess) in a noncontact state to form the exhaust path 401 as a so-called labyrinth-shaped exhaust path.

The labyrinth-shaped exhaust path 401 also functions as a noncontact seal. While the I-shaped shield 40b (projection) is fitted in the U-shaped portion (recess) formed at the distal end of the shield 40a1, a noncontact state, that is, a predetermined gap is formed between the recess and the projection. Upon the fitting of the projection in the recess, the exhaust path 401 is shielded. This makes it possible to prevent sputter particles sputtered from the target 4 from passing through the exhaust path 401 and entering the exhaust chamber 8 and, eventually, to prevent particles from adhering to the inner wall of the exhaust chamber 8.

Similarly, the shield 40a2 is fixed around the opening 303 of the shutter accommodation unit 23 so as to cover the exhaust port 301 of the exhaust chamber 8. The shield 40a2 and the shield 22 connected to the substrate holder 7 form the exhaust path 403. The shield 22 has a U-shaped recessed distal end, and the I-shaped shield 40a2 (projection) is fitted in the U-shaped portion (recess) in a noncontact state to form the exhaust path 403 as a labyrinth-shaped exhaust path. Upon the fitting of the projection of the shield 40a2 in the recess of the shield 22, the exhaust path 403 is shielded. This makes it possible to prevent sputter particles sputtered from the target 4 from passing through the exhaust path 403 and entering the exhaust chamber 8 and, eventually, to prevent particles from adhering to the inner wall of the exhaust chamber 8.

The exhaust conductance is sufficiently higher in the exhaust path 401 than in the exhaust path 403 at the position to which the substrate holder has ascended, as shown in FIG. 1. That is, a gas flowing into the exhaust chamber 8 flows more easily through the exhaust path 401 than through the exhaust path 403. When two exhaust conductances are connected parallel to each other, the combined conductance is the sum of these exhaust conductances. Therefore, as long as one exhaust conductance is sufficiently higher than the other exhaust conductance, the lower conductance can be ignored. This means that the exhaust path 403 is not indispensable. When the structure of the exhaust path 401 or 403 is used, the exhaust conductance can be adjusted in accordance with the width of the gap of the exhaust path and the distance (length) across which the labyrinth-shaped portions of the exhaust path overlap each other.

As shown in, for example, FIG. 3, the widths of the gaps of the exhaust paths 401 and 403 are nearly the same, and the distance (length) across which the labyrinth-shaped portions of the exhaust path 401 overlap each other is shorter than that across which the labyrinth-shaped portions of the exhaust path 403 overlap each other, so the exhaust conductance is higher in the exhaust path 401 than in the exhaust path 403. Hence, a gas introduced from an inert gas supply system 15 or a reactive gas supply system 17 into the process space in the chamber 2 (a space which is surrounded by the shield and target and filled with a plasma) is exhausted mainly through the exhaust path 401. This means that the exhaust conductance from the process space in the chamber 2 to the exhaust chamber 8 is not influenced by an operation of opening/closing the substrate shutter 19. Because the main exhaust path from the process space in the chamber 2 to the exhaust chamber 8 is formed at a position at which it is not influenced by opening/closing of the substrate shutter 19, the exhaust conductance from the process space in the chamber 2 to the exhaust chamber 8 remains the same upon opening/closing of the substrate shutter 19. This makes it possible to stabilize the pressure of the gas in the process space within the vacuum chamber 2, which influences plasma generation upon opening/closing of the substrate shutter 19. Therefore, even when the substrate shutter 19 is opened/closed, it is possible to suppress a change in exhaust conductance from the process space in the vacuum chamber 2 to the exhaust chamber 8 to stabilize the pressure in the vacuum chamber 2, thus allowing high-quality deposition.

Figure 6:
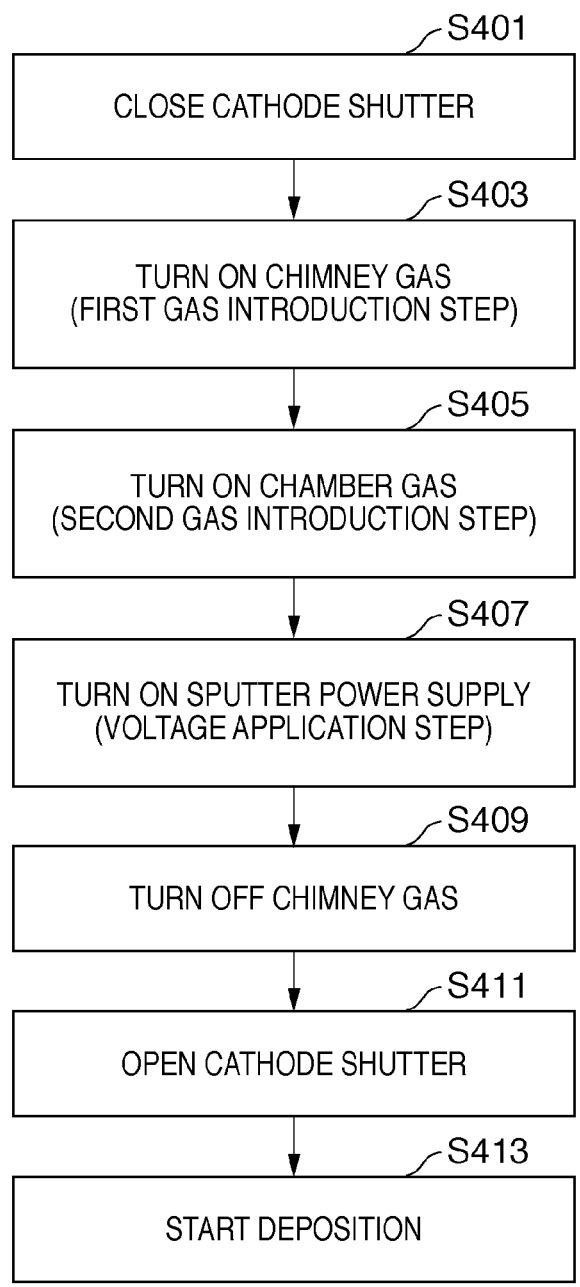
FIG. 6 is a flowchart showing a method according to the embodiment.

An electronic device manufacturing method using the sputtering apparatus 1 will be described with reference to FIG. 6. Note that the sputtering apparatus 1 undergoes, for example, ON/OFF control of a sputter power supply 12 and gas introduction control (of a first gas (inert gas) supply device 52 and second gas (inert gas) supply device 54) by a control unit 100. In step S401, the control unit 100 actuates the cathode shutter driving mechanism 33 to close the cathode shutter 14, as shown in FIG. 1. Also, the control unit 100 actuates the substrate shutter driving mechanism 32 to close the substrate shutter 19.

In step S403 (first gas introduction step), the control unit 100 introduces a process gas (for example, argon) from the first gas pipe 34 disposed at the distal end of the chimney shield 9 by actuating the first gas (inert gas) supply device 52. The target space surrounded by the cathode shutter 14, target holder 6, and cylindrical shield 40 is filled with the process gas.

In step S405 (second gas introduction step), the control unit 100 actuates the second gas (inert gas) supply device 54 and introduces via the second gas pipe (second inert gas introduction port) 35 a process gas (for example, argon) to the exterior of the sputtering space defined by the deposition shield plate 40, target 4, and substrate holder 7 disposed in the vacuum chamber 2. This means that a process gas is introduced into the space between the cathode shutter 14 and the inner wall (ceiling wall) of the process chamber. Note that in this step, not only a process gas but also a reactive gas may be introduced by internal introduction, that is, using the first gas pipe 34.

In step S407 (voltage application step), the control unit 100 actuates the sputter power supply 12 to apply a voltage to the target holder 6. As shown in FIG. 1, by applying a voltage to the target holder 6 while the cathode shutter 14 is closed, electric discharge can be started at a pressure high enough to easily ignite a plasma.

In step S409, the control unit 100 stops the first gas (inert gas) supply device 52 and the process gas introduction from the first gas pipe 34. In step S411, the control unit 100 actuates the cathode shutter driving mechanism 33 to open the cathode shutter 14, and then actuates the substrate shutter driving mechanism 32 to open the substrate shutter 19, thereby starting a deposition process in step S413. Note that the deposition shield plate 40, for example, is periodically replaced after a predetermined number of repetitions of the deposition process. The deposition shield plate 40 having a film adhering on it is sometimes replaced with another, new deposition shield plate in some cases or utilized again after cleaning in other cases.

Upon this operation, during the deposition process, a process gas is introduced from the exterior of the sputtering space. The introduced process gas spreads in the chamber so that all the spaces in the chamber have a uniform pressure. The same applies to the above-mentioned defined sputtering space, and means that both the interior and exterior of the sputtering space have the same pressure. Hence, even when the size of the gap 60 changes upon periodical replacement such as deposition shield plate replacement, the pressure in the sputtering space can be stabilized.

Note that an electronic device to which the present invention is applicable is not particularly limited. Examples of an electronic device to which the present invention is applicable include a transistor, diode, IC (integrated circuit), display, wireless IC tag, photosensor, image sensor, gas sensor, pressure sensor, laser device, optical switching device, electroluminescent device, liquid crystal backlight, and liquid crystal display device.

Figure 7:
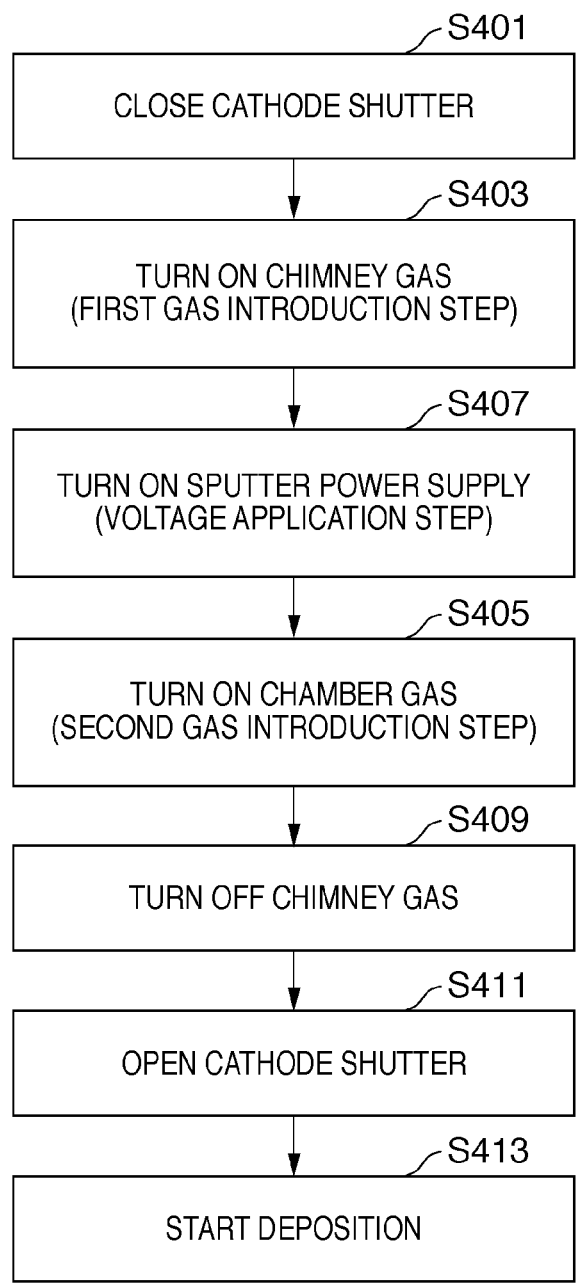
FIG. 7 illustrates a modification of the flowchart showing the method according to the embodiment.

FIG. 7 illustrates a modification of the flowchart showing the manufacturing method according to this embodiment. FIG. 7 is different in order of steps S405 and S407 from FIG. 3. When a voltage is applied to the target holder 6 in step S407 (voltage application step), and then a process gas is introduced to the exterior of the sputtering space in step S405 (second gas introduction step) as well, the pressure in the sputtering space can be stabilized in the same way. Note that the deposition shield plate 40, for example, is periodically replaced after a predetermined number of repetitions of the deposition process. The deposition shield plate 40 having a film adhering on it is sometimes replaced with another, new deposition shield plate in some cases or utilized again after cleaning in other cases.

(Modification)

Although a process gas is introduced from the introduction port 34 placed in the target space surrounded by the cathode shutter 14, target holder 6, and cylindrical shield 40 in the above-mentioned embodiment, the present invention is not limited to this, and a first gas pipe (first inert gas introduction port) may be placed anywhere in the sputtering space. Also, the process gas introduced from each of the first gas pipe 34 and second gas pipe 35 may be an inert gas such as argon, xenon, or krypton or a reactive gas such as oxygen or nitrogen. Moreover, the process gas introduced from the first gas pipe 34 and that introduced from the second gas pipe 35 may be of the same type or different types. Again, although the first gas introduction step in which a process gas is introduced from the first gas introduction port is performed, and then the second gas introduction step in which a process gas is introduced from the second gas introduction port formed outside the sputtering space is performed, the present invention is not limited to this. Upon adjustment of the flow rate, the first gas introduction step may be performed, for example, after or simultaneously with the second gas introduction step.

As another modification of internal gas introduction according to this embodiment, a gas introduction system 161 may be provided to introduce a process gas (for example, argon) into the shutter accommodation unit 23. This means that a sputtering space is formed in the shutter accommodation unit 23.

Figure 8:
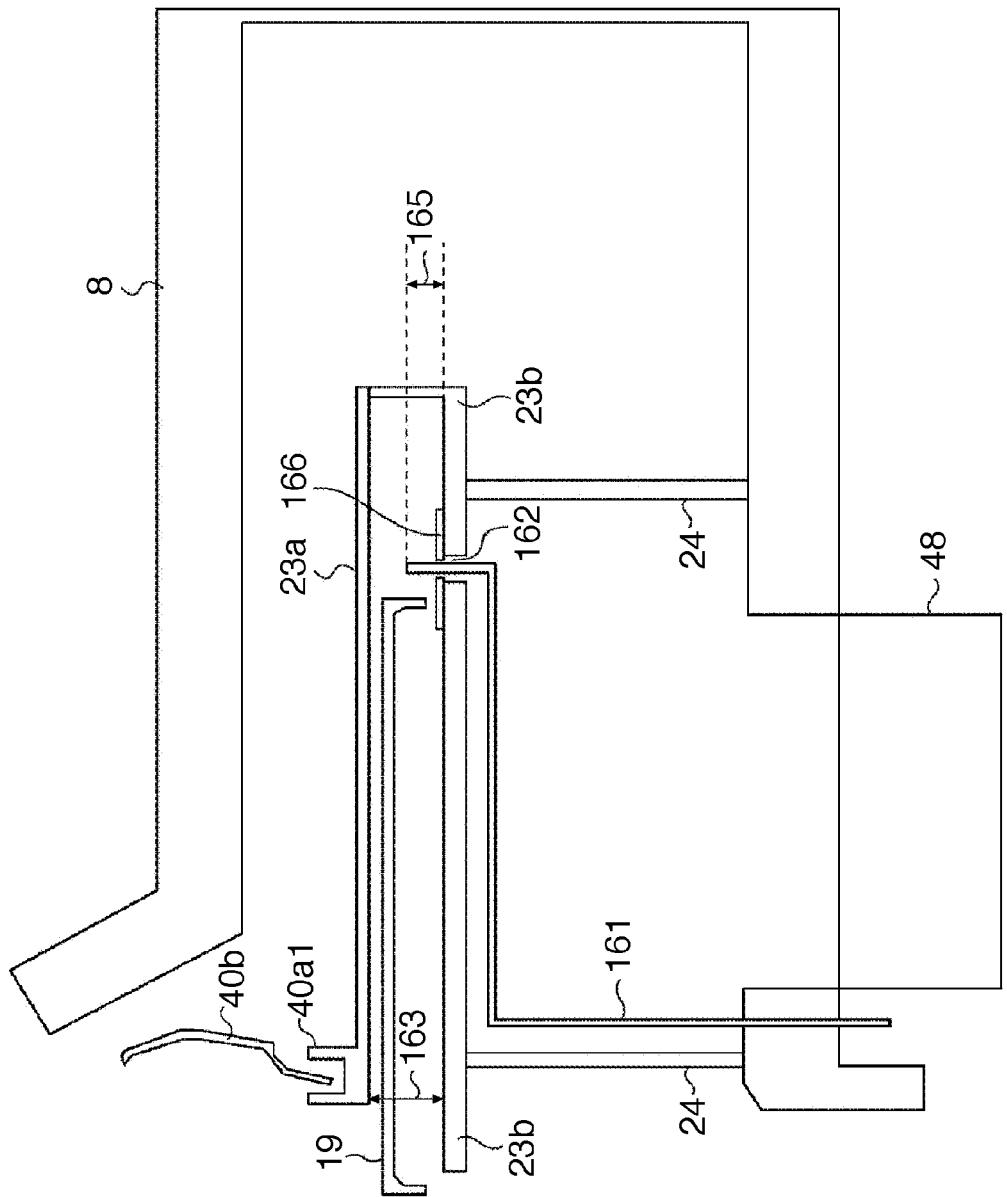
FIG. 8 is an enlarged view for explaining a configuration which introduces a reactive gas into a shutter accommodation unit according to the embodiment.

FIG. 8 is an enlarged view for explaining a configuration which introduces a reactive gas into the shutter accommodation unit 23 according to this embodiment. The shutter accommodation unit 23 is formed by a cover plate 23a and frame body 23b for the sake of easy replacement and cleaning, as shown in FIG. 8. The gas introduction pipe 161 is placed so as to introduce a gas from the exterior to the interior of the exhaust chamber 8, and reaches the interior of the shutter accommodation unit 23 through a gas introduction opening 162 formed in the frame body 23b of the shutter accommodation unit 23. Note that the gas introduction opening 162 has a circular shape, which has a diameter larger than that of the gas introduction pipe 161. In this embodiment, the gas introduction pipe 161 has a diameter of 6.35 mm, the gas introduction opening 162 has a diameter of 7 mm, and the gas pipe protruding into the shutter accommodation unit 23 has a length 165 of 15 mm. The opening 162 of the shutter accommodation unit 23 has a height 163 of 33 mm and a width of 450 mm (not shown). The gap formed between the gas introduction pipe 161 and the opening 162 due to the difference in diameter is about 0.5 mm, which is sufficiently smaller than the height 163 of the shutter accommodation unit 23, that is, 33 mm. Since the gas flows through a flow channel having a high conductance (high level of ease in gas flow), it is desired to set the conductance from the shutter accommodation unit 23 to the process space sufficiently higher than that of the gap between the gas introduction pipe 161 and the opening 162, as in this case. This is done because the gas can be reliably introduced into the process space even in the presence of processing variations in shape of the opening 162 or variations in mounting position of the shutter accommodation unit 23. The effect of stabilizing the deposition characteristics by reliably introducing the gas is especially remarkable when a reactive gas is used.

It is also desired to set the position of the gas introduction opening 162 on the opposite side of the opening 303 of the shutter accommodation unit 23 relative to the position of the substrate shutter 19 as the substrate shutter 19 is in a retracted state, as shown in FIG. 8. Since sputter particles can hardly reach this position, it is possible to prevent sputter particles from clogging the gas blowoff port of the reactive gas introduction system including the gas introduction pipe 161, or sputter particles adhering on the gas pipe from contaminating the substrate upon peeling and scattering into the exhaust chamber 8. A reactive gas supply device (gas cylinder) is connected to the reactive gas introduction system to supply a reactive gas.

Further, a conductance adjusting member 166 including an opening into which the gas introduction pipe 161 is to be inserted may be detachably provided to cover the gas introduction opening 162, as shown in FIG. 8. In this case, the diameter of the gas introduction opening 162 is desirably sufficiently larger than that of the gas introduction pipe 161, for example, 12 mm or more, and the diameter of the opening of the conductance adjusting member 166, into which the gas pipe is to be inserted, is desirably slightly larger than the outer diameter of the gas introduction pipe 161, for example, 7 mm or more. As a method of mounting the shutter accommodation unit 23, first, the shutter accommodation unit 23 is screwed into a column 24 while the gas introduction pipe 161 is inserted in the gas introduction opening 162 formed in the shutter accommodation unit 23, and the conductance adjusting member 166 is placed so as to surround the gas introduction pipe 161. Then, the cover plate 23a of the shutter accommodation unit 23 is fixed to the upper portion of the frame body 23b of the shutter accommodation unit 23 by, for example, screwing. This procedure makes it possible to prevent dust generation as the gas introduction pipe 161 comes into contact with the frame body 23b of the shutter accommodation unit 23 or damage to the shutter accommodation unit 23 or gas introduction pipe 161, when the frame body 23b is mounted.

As described above, in the first gas introduction step (step S403) mentioned earlier with reference to FIGS. 6 and 7, a process gas may be introduced from the gas introduction pipe 161 in place of the gas port 34. Also, in the second gas introduction step (step S405), a process gas may be introduced from the gas introduction port 35 and a reactive gas may be introduced from the gas introduction pipe 161 (third gas introduction port).

Figure 9:
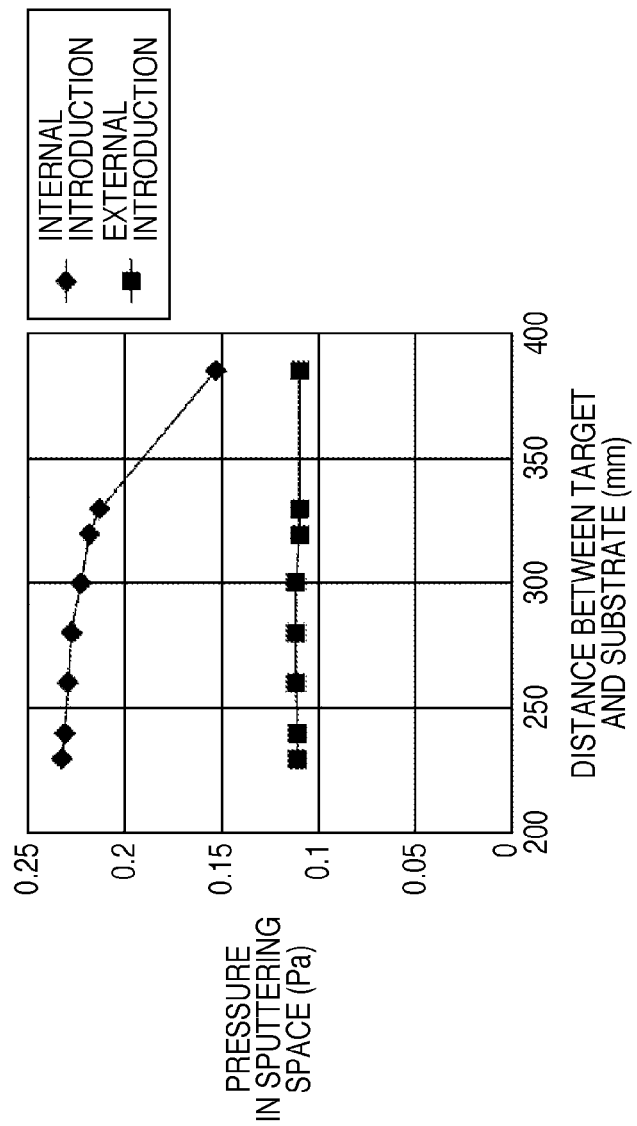
FIG. 9 is a graph showing the pressure (Pa) in a sputtering space when the distance (mm) between a target and a substrate is changed.

FIG. 9 is a graph showing the pressure (Pa) in the sputtering space when the sputtering apparatus 1 according to this embodiment is used and the distance (mm) between the target and the substrate is changed. More specifically, FIG. 9 shows a change in pressure within the sputtering space when the substrate holder 7 is moved by the substrate holder driving mechanism 31, and the exhaust conductance of the exhaust path 403 is changed. As can be seen from FIG. 9, when internal introduction is done, that is, a process gas is directly introduced into the sputtering space, the pressure in the sputtering space decreases as the distance between the target and the substrate increases (the exhaust conductance increases). On the other hand, when external introduction is done, that is, a plasma gas is introduced from the exterior of the sputtering space, the pressure in the sputtering space changes only slightly even when the distance between the target and the substrate increases (even when the exhaust conductance increases). Sputter particles sputtered from the target are ejected in a direction (called an ejection angle distribution) which varies depending on the type of target material. Therefore, to optimize the thickness distribution of a film formed on the substrate, it is necessary to change the distance between the target and the substrate in accordance with the type of target material. However, upon this change, the pressure in the sputtering space also changes, and this is not preferable in terms of ensuring the property of an electronic device. According to this embodiment, the pressure in the sputtering space remains the same even when the distance between the target and the substrate changes, so no such problem is posed.

The present invention is not limited to the above-described embodiments, and various changes and modifications can be made within the spirit and scope of the present invention. Therefore, to apprise the public of the scope of the present invention, the following claims are made.

This application claims the benefit of Japanese Patent Application No. 2009-293664, filed Dec. 25, 2009, which is hereby incorporated by reference herein in its entirety.

The invention claimed is:

1. A sputtering method by applying a voltage to a target in a process chamber, comprising:
   a first step of introducing an inert gas from a first gas introduction port arranged adjacent to a target in a sputtering space defined by a substrate holder, the target and a deposition shield plate which are arranged in the process chamber;
   a second step of applying the voltage to the target and starting an electric discharge in the process chamber after the first step; and
   a third step of introducing an inert gas from a second gas introduction port arranged outside the sputtering space and spreading the inert gas from an exterior to interior of the sputtering space.

2. The method according to claim 1, further comprising a cathode shutter arranged in front of the target,
   the first gas introduction port is arranged in a target space which is surrounded by the cathode shutter, the target and a shield surrounding the target.

3. The method according to claim 2, wherein the first gas introduction port is arranged at a distal end of the shield.

4. The method according to claim 2, wherein the second gas introduction port is arranged between the cathode shutter and an inner wall of the process chamber.

5. The method according to claim 1, further comprising a step of replacing the deposition shield plate with another deposition shield plate.

6. The method according to claim 1, further comprising a step of removing and cleaning the deposition shield plate, and mounting the cleaned deposition shield plate in the process chamber.

7. The method according to claim 1, wherein in the third step, the inert gas is introduced from the second introduction port and a reactive gas is introduced from a third gas introduction port, which is different from the second gas introduction port and arranged in the sputtering space.

8. The method according to claim 1, wherein in a fourth step after the third step, the gas introduction from the first gas introduction port is stopped and film deposition process is started.

9. The method according to claim 1, wherein in the third step, the inert gas is introduced from an exterior of the sputtering space and spread in the sputtering space via a gap formed in the deposition shied plate.

10. A sputtering method by applying a voltage to a target in a process chamber, comprising:
    a first step of introducing a process gas from a first gas introduction port arranged adjacent to a target in a sputtering space defined by a substrate holder, the target and a deposition shield plate which are arranged in the process chamber;
    a second step of introducing a process gas from a second gas introduction port arranged outside the sputtering space and spreading the process gas from an exterior to interior of the sputtering space; and
    a third step of applying the voltage to the target and starting an electric discharge in the process chamber after the second step,
    wherein the process gas introduced in the first and second steps includes at least an inert gas.

11. The method according to claim 10, further comprising a cathode shutter arranged in front of the target,
    the first gas introduction port is arranged in a target space which is surrounded by the cathode shutter, the target and a shield surrounding the target.

12. The method according to claim 11, wherein the first gas introduction port is arranged at a distal end of the shield.

13. The method according to claim 11, wherein the second gas introduction port is arranged between the cathode shutter and an inner wall of the process chamber.

14. The method according to claim 10, further comprising a step of replacing the deposition shield plate with another deposition shield plate.

15. The method according to claim 10, further comprising a step of removing and cleaning the deposition shield plate, and mounting the cleaned deposition shield plate in the process chamber.

16. The method according to claim 10, wherein in the second step, the inert gas is introduced from the second introduction port and a reactive gas is introduced from a third gas introduction port, which is different from the second gas introduction port and arranged in the sputtering space.

17. The method according to claim 10, wherein the process gas introduced from the first gas introduction port and the process gas introduced from the first gas introduction port are same.

18. The method according to claim 10, wherein the process gas introduced from the first gas introduction port includes a reactive gas.

19. The method according to claim 10, wherein in a fourth step after the third step, the gas introduction from the first gas introduction port is stopped and film deposition process is started.

20. The method according to claim 10, wherein in the second step, the inert gas is introduced from an exterior of the sputtering space and spread in the sputtering space via a gap formed in the deposition shied plate.

* * * * *